United States Patent
Jiang et al.

(10) Patent No.: US 10,815,076 B2
(45) Date of Patent: Oct. 27, 2020

(54) PANEL CARRIER AND LOADING PLATE STRUCTURE THEREOF

(71) Applicant: Wuhan China Star Optoelectronics Technology Co., Ltd., Wuhan, Hubei (CN)

(72) Inventors: Ming Jiang, Hubei (CN); Peilin Wu, Hubei (CN); Chiahuang Chang, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 131 days.

(21) Appl. No.: 15/740,115

(22) PCT Filed: Oct. 27, 2017

(86) PCT No.: PCT/CN2017/107925
§ 371 (c)(1),
(2) Date: Aug. 24, 2018

(87) PCT Pub. No.: WO2019/061623
PCT Pub. Date: Apr. 4, 2019

(65) Prior Publication Data
US 2019/0092579 A1    Mar. 28, 2019

(30) Foreign Application Priority Data
Sep. 26, 2017 (CN) .......................... 2017 1 0884144

(51) Int. Cl.
*B65G 49/06* (2006.01)
(52) U.S. Cl.
CPC ......... *B65G 49/061* (2013.01); *B65G 49/067* (2013.01); *B65G 49/068* (2013.01); *B65G 2201/0297* (2013.01)

(58) Field of Classification Search
CPC .. B65G 49/061; B65G 49/067; B65G 49/068; B65G 2201/0297
(Continued)

(56) References Cited

U.S. PATENT DOCUMENTS

| | | | |
|---|---|---|---|
| 2017/0260011 A1* | 9/2017 | Schoeppe | B65G 49/061 |
| 2018/0016179 A1* | 1/2018 | Canfield | B32B 7/06 |
| 2019/0271344 A1* | 9/2019 | Boughton | H01L 21/68785 |

FOREIGN PATENT DOCUMENTS

| | | |
|---|---|---|
| CN | 203372632 U | 1/2014 |
| CN | 205972212 U | 2/2017 |

* cited by examiner

*Primary Examiner* — Saul Rodriguez
*Assistant Examiner* — Brendan P Tighe
(74) *Attorney, Agent, or Firm* — Hemisphere Law, PLLC; Zhigang Ma

(57) ABSTRACT

A loading plate structure and a carrier are provided. The loading plate structure applied to a panel carrier for transporting panels. The loading plate structure comprises of a main body, the main body including at least one recess for receiving a panel therein, wherein a size of any side of the at least one recess is larger than a size of a corresponding side of the panel received therein, and a taking/disposing location formed on the main body with an opening for taking or disposing the panel, wherein through the taking/disposing location the panel is disposed in one recess corresponding to a size of the panel, or is taken out from the recess. The loading plate structure and the carrier can prevent effectively the panels from falling in transport process, promote transport efficiency and product yields, and increase the convenience of late maintenance and cost control.

14 Claims, 2 Drawing Sheets

(58) Field of Classification Search
USPC .................................................. 414/222.01
See application file for complete search history.

PANEL CARRIER AND LOADING PLATE STRUCTURE THEREOF

RELATED APPLICATIONS

The present application is a National Phase of International Application Number PCT/CN2017/107925, filed Oct. 27, 2017, and claims the priority of China Application No. 201710884144.1, filed Sep. 26, 2017.

FIELD OF THE DISCLOSURE

The disclosure relates to a display panel technical field, and more particularly to a panel carrier and a loading plate structure thereof.

BACKGROUND

In current technology, the carrying basket or the conventional cassette are applied to be the carrier for loading the panels such as glass substrates.

The technical issue of using the carrying basket is that the robot arm could not enter inside of the carrying basket for taking or disposing the panel, so the manual work is required to take or dispose the panel, the automatic loading/unloading panel could not be fulfilled, and the labor costs are increasing. When the cassette is used, the robot arm would dispose the panel on the support bar at lateral side of the cassette by line contact. The technical issue is the anti-skid ability of the support bar at the lateral side is very bad, so when the transport device is running at a high speed, the panel is easy to shift or fall. Besides, the support bars at lateral side of the cassette are consumables, so the cost of late replacement and purchase is kept high.

SUMMARY

For solving the above technical issues, the present invention provides a panel carrier and loading plate structures thereof to prevent effectively the panels from falling in transport process, to take the panel easily for promoting transport efficiency and product yields, and to reduce mold opening cost for the convenience of late maintenance and cost control.

For solving the above technical issues, the present invention provides a loading plate structure applied to a panel carrier for transporting panels. The loading plate structure comprises of a main body, the main body including at least one recess for receiving a panel therein, wherein a size of any side of the at least one recess is larger than a size of a corresponding side of the panel received therein, and a taking/disposing location formed on the main body with an opening for taking or disposing the panel, wherein through the taking/disposing location the panel is disposed in one of the at least one recess corresponding to a size of the panel, or is taken out from the one of the at least one recess.

In one embodiment, the main body includes of: a first plate and a second plate disposed corresponding to the first plate; and the at least one recess including two sub-recesses separately formed on the first plate and the second plate, wherein the sizes and the positions of the two sub-recesses are mutually matched, to have the panel be received and supported collectively by the two sub-recesses formed on the first plate and the second plate individually.

In one embodiment, the first plate and the second plate are symmetrical to each other.

In one embodiment, the taking/disposing location is an interval area between the first plate and the second plate.

In one embodiment, a width of the interval area is about 55 mm to 90 mm.

In one embodiment, multiple of the at least one recess are disposed adjacently one by one on the main body, wherein the recess with small size is formed on a bottom surface of the main body, and the recesses are disposed one by one from bottom to top according to increasing size thereof.

In one embodiment, multiple of the at least one recess are disposed adjacently one by one on the main body from one side of the main body.

In one embodiment, the size of any side of any of the at least one recess is larger than the size of the corresponding side of the panel received therein about 2 mm.

For solving the above technical issues, the present invention provides a panel carrier. The panel carrier comprises an outer frame loaded thereon with multiple loading plate structures for transporting panels, wherein the multiple loading plate structures have a same specification and are arranged regularly. Each the loading plate structure comprises a main body, the main body including at least one recess for receiving a panel therein, wherein a size of any side of the at least one recess is larger than a size of a corresponding side of a panel received therein, and a taking/disposing location formed on the main body with an opening for taking or disposing the panel, wherein through the taking/disposing location the panel is disposed in one of the at least one recess corresponding to a size of the panel, or is taken out from the one of the at least one recess.

In one embodiment, the specification of the multiple loading plate structures for transporting the panels loaded on the outer frame are adjustable.

In one embodiment, multiple of the at least one recess are disposed adjacently one by one on the main body, wherein the recess with small size is formed on a bottom surface of the main body, and the recesses are disposed one by one from bottom to top according to increasing size thereof.

In one embodiment, the main body includes a first plate and a second plate disposed corresponding to the first plate, the at least one recess including two sub-recesses separately formed on the first plate and the second plate, wherein the sizes and the positions of the two sub-recesses are mutually matched, to have the panel be received and supported collectively by the two sub-recesses formed on the first plate and the second plate individually.

In one embodiment, multiple of the at least one recess are disposed on the main body adjacently one by one from one side of the main body.

In one embodiment, the size of any side of any of the at least one recess is larger than the size of the corresponding side of the panel received therein about 2 mm.

In one embodiment, the first plate and the second plate are symmetrical to each other.

In one embodiment, the taking/disposing location is an interval area between the first plate and the second plate.

In one embodiment, a width of the interval area is about 55 mm to 90 mm.

The panel carrier and the loading plate structures provided by the present invention have the following advantages.

First, the main body of the loading plate structure comprises at least one recess for loading the panel and the taking/disposing location formed thereon, through the taking/disposing location, the panel is disposed in the recess corresponding to the size of the panel, or is taken out from the recess, and the recess can support the panel by surface contact, to avoid of touching by hands and to prevent the panels falling in transport process, to effectively prevent the panels from falling in transport process of automatic storing, and to promote product yields.

Second, because the recesses are disposed adjacently one by one on the loading plate structure, only one time of mold opening can form the multiple recesses on the loading plate structure for loading different sizes of panels, to further reduce the cost.

Third, the reasonable structure of the panel carrier can promote the efficiency of automatic transport and the convenience of late maintenance.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description, Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

The disclosure will be further described in detail with reference to accompanying drawings and preferred embodiments as follows. The specific structural and functional details disclosed herein are only representative and are intended for describing exemplary embodiments of the disclosure. However, the disclosure can be embodied in many forms of substitution, and should not be interpreted as merely limited to the embodiments described herein. All other embodiments obtained by persons of ordinary skill in the art based on the embodiments of the present invention without creative efforts shall fall within the protection scope of the present invention.

Figure 1:
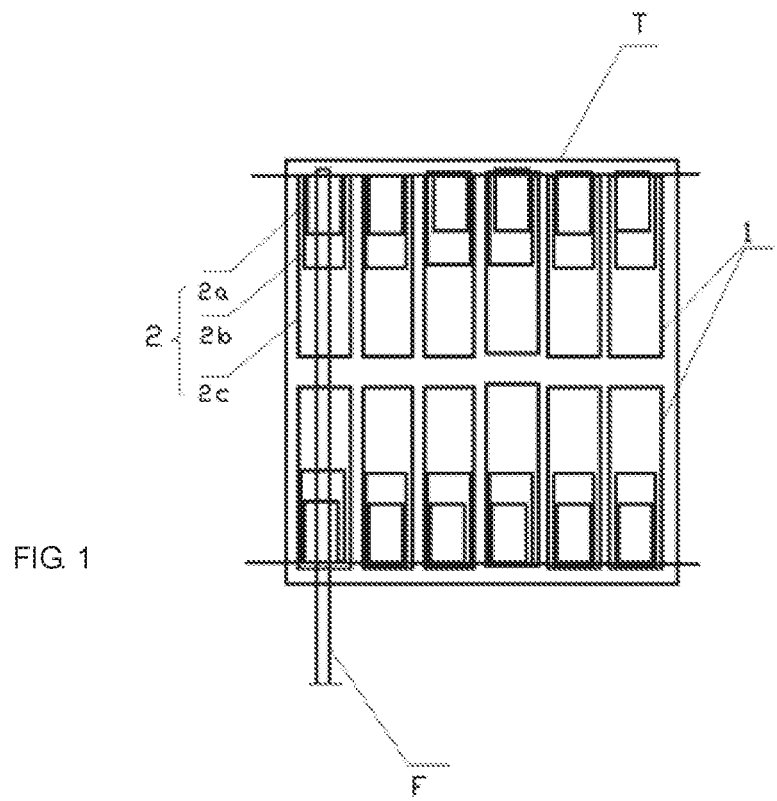
FIG. 1 is a structural top view of a panel carrier according to first embodiment of the disclosure.

FIG. 1 illustrates a panel carrier in first embodiment of the present invention.

The panel carrier in this embodiment comprises an outer frame T. The outer frame T includes multiple loading plate structures for transporting panels loaded thereon. The multiple loading plate structures are arranged in an array of two rows and six columns on the outer frame T. As shown in FIG. 1, two rows, the upper row and the lower row, of loading plate structures, are disposed axisymmetric to have a robot arm F can take or dispose panels such as glass substrate from two sides of the outer frame T conveniently.

Besides, in this embodiment, the multiple loading plate structures have the same specification, so it is convenient to automatic store and transport the panels.

Figure 2:
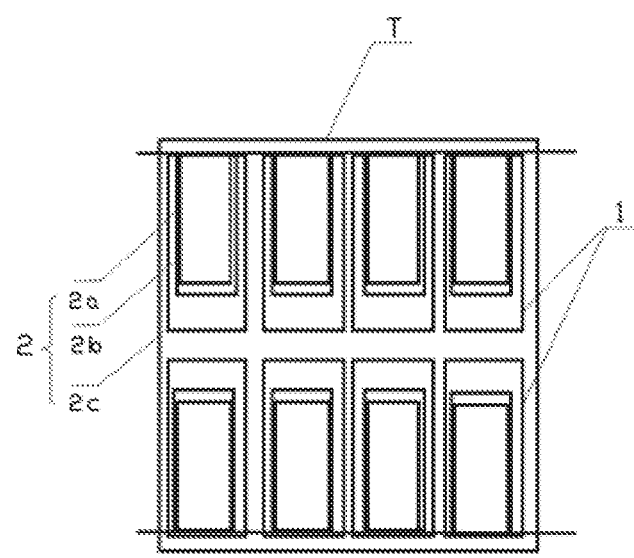
FIG. 2 is a structural top view of a panel carrier according to second embodiment of the disclosure.

In other embodiments, the specification of the multiple loading plate structures for transporting panels loaded on the outer frame T are adjustable. As shown in FIG. 2, a panel carrier in second embodiment of the present invention is illustrated.

In this embodiment, the outer frame T includes multiple loading plate structures arranged in an array of two rows and four columns for transporting panels loaded thereon. As shown in FIG. 2, the upper row and lower row of loading plate structures are disposed axisymmetric. The function of arranging the loading plate structures into the upper row and the lower row is for increasing the quantity of panels to be loaded and for promoting the transporting efficiency, because the robot arm F can take or dispose panels, such as glass substrates, conveniently from the upper side or the lower side of the outer frame T as shown in FIG. 2. Besides, the specification of the loading plate structures loaded on the outer frame T are adjustable, so the same one outer frame T can be adapted to load more types of loading plate structures. By applying the same one outer frame, it is easy to transport various panels by using the transporting apparatus and the cost could be further reduced.

The loading plate structures of the first embodiment and the second embodiment are further illustrated as follows. A loading plate structure applied to a panel carrier for transporting panels comprises a main body 1. The main body 1 includes at least one recess 2 thereon for receiving a panel. In this embodiment, three recesses 2a, 2b and 2c are formed on the main body 1.

Figure 3:
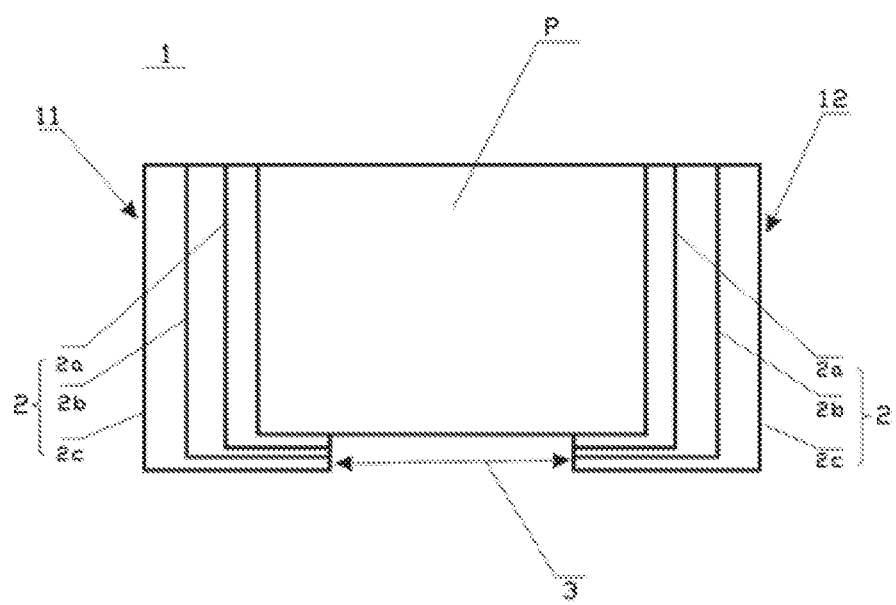
FIG. 3 is a structural schematic view of a loading plate structure applied to a panel carrier for transporting panels according to an embodiment of the disclosure.

The size of any side of the at least one recess 2 is larger than the size of the corresponding side of the panel P received therein, as shown in FIG. 3. For example, the length of the long side of the recess 2a is larger than the length of the long side of the panel P as shown in FIG. 3, and the width of the short side of the recess 2a is larger than the width of the short side of the panel P as shown in FIG. 3.

Preferably, the size of any side of any of the at least one recess 2 is larger than the size of the corresponding side of the panel received therein about 2 mm. Namely, the length of the long side of the recess 2a is larger than the length of the long side of the panel P about 2 mm as shown in FIG. 3, and the width of the short side of the recess 2a is also larger than the width of the short side of the panel P about 2 mm as shown in FIG. 3. Thus, the assembly error and the issue of invalid adaption can be prevented. Similarly, the size of any side of the recess 2b is larger than the size of the corresponding side of the panel P about 2 mm, and the size of any side of the recess 2c is also larger than the size of the corresponding side of the panel P about 2 mm.

In other embodiments, the recesses are formed with specific sizes according to the different sizes of the panels. Then, each size of the panel could be loaded in a specific recess corresponding to the panel.

The loading plate structure further comprises a taking/disposing location 3 formed on the main body 1 with an opening for taking or disposing the panel P. Through the taking/disposing location 3, the panel P is disposed in one recess 2a corresponding to the size of the panel P, or is taken out from the recess 2a.

multiple of the at least one recess 2 are disposed adjacently one by one on the main body 1. For example, a main body 1 is formed with three recesses 2a, 2b and 2c. The recess 2a with the smallest length and width is formed on a bottom surface of the main body 1. On the peripheral area of the recess 2a of the same one main body 1, the recess 2b is formed relatively higher than the recess 2a, and the recess 2c is formed relatively higher than the recess 2b. Thus, by applying one time of mold opening, the same one main body 1 could load multiple size of the panels. it is understandable that the recesses 2a, 2b and 2c are disposed one by one on the main body 1. The recess 2a with small size is formed on a bottom surface of the main body 1, and the recesses 2b and 2c are disposed one by one from bottom to top according to increasing size thereof.

Besides, the number of the recesses 2 formed on the same one main body 1 is not limited. The number of the recesses 2 could be three as illustrated in this embodiment, however, the number could be more, like five or six, etc., as long as it satisfies the requirement of disposing multiple recesses 2 one by one adjacently on the main body 1.

In this embodiment, because the recess 2 is like a sink structure, the panel can be supported in the recess 2 by surface contact, thereby to solve the situation of loading the panel only by line contact with the edge of the panel in prior art.

Further, the main body 1 in this embodiment comprises a first plate 11 and a second plate 12 disposed corresponding to the first plate 11. Each recess 2a, 2b or 2c includes two sub-recesses, with mutually matched sizes and positions, separately formed on the first plate 11 and the second plate 12.

Two sub-recesses being mutually matched to each other means the supporting surfaces of two sub-recesses are at the same plane and the size of the combination of two sub-recesses can have the recess 2a, 2b or 2c satisfy the size of the corresponding panel. The panel P could be received and supported collectively by the two sub-recesses formed on the first plate 11 and the second plate 12 individually.

Preferably, the first plate 11 and the second plate 12 are symmetrical to each other for the convenience of easy assembling, fixing and maintaining.

Further, because the main body 1 is assembled by two plates, the taking/disposing location 3 is an interval area between the first plate 11 and the second plate 12. In this embodiment, the width of the interval area is about 55 mm to 90 mm, thereby it is convenient for a robot arm to take or dispose the panels.

Preferably, the recesses 2a, 2b and 2c are disposed adjacently one by one on the main body 1 from one side of the main body 1. As shown in FIG. 1 and FIG. 2, the recesses 2a, 2b and 2c of the upper row are formed one by one on the upper side of the main body (referred by the horizontal straight line in Figures), and the recesses 2a, 2b and 2c of the lower row are also formed one by one on the lower side of the main body (referred by the horizontal straight line in Figures). Thus, it is convenient for the robot arm F to take or dispose the panels, such as glass substrate, from the upper side or the lower side of the outer frame T as shown in FIG. 2, thereby to promote the transporting efficiency.

When the panel carrier in this embodiment is implemented, the robot arm F can dispose the panel P through the taking/disposing location 3 into one recess 2a corresponding to the size of the panel P, or take the panel P out from the recess 2a. Other size of panels can also be disposed in the corresponding recesses by above method. When a certain amount of the panels are disposed on the main body of the loading plate structure on the outer frame T, the outer frame T can be transported as a whole to fulfill the automatic storage and transport.

The panel carrier and the loading plate structures provided by the present invention have the following advantages.

First, it is effective to prevent the panels from falling in transport process of automatic storing and to promote product yields. In specific, the main body includes at least one recess for loading the panel and the taking/disposing location formed thereon, through the taking/disposing location, the panel is disposed in the recess corresponding to the size of the panel, or is taken out from the recess. The recess can support the panel by surface contact to avoid of touching by hands and to prevent the panels falling in transport process.

Second, because the recesses are disposed adjacently one by one on the loading plate structure, just one time of mold opening can form the multiple recesses on the loading plate structure for loading different sizes of panels. Therefore, the cost could be further reduced.

The reasonable structure of the panel carrier and loading plate structure can promote the efficiency of automatic transport and the convenience of late maintenance.

The foregoing contents are detailed description of the disclosure in conjunction with specific preferred embodiments and concrete embodiments of the disclosure are not limited to these descriptions. For the person skilled in the art of the disclosure, without departing from the concept of the disclosure, simple deductions or substitutions can be made and should be included in the protection scope of the application.

What is claimed is:

1. A loading plate structure applied to a panel carrier for transporting panels, comprising:
   a main body;
   said main body including at least three recesses respectively for receiving at least three different sizes of panels therein, wherein a size of any side of each of said at least three recesses is larger than a size of a corresponding side of a corresponding one of the panels received therein; and
   a taking/disposing location formed on said main body with an opening for taking or disposing the panels, wherein through said taking/disposing location the panel is disposed in one of said at least three recesses corresponding to a size of the panel, or is taken out from said one of said at least three recesses;
   wherein said at least three recesses are formed on the main body from bottom to top in a stepped manner, a smallest size of recess in said at least three recesses is formed on a bottom surface of the main body, and the other recesses in said at least three recesses are disposed one by one from bottom to top with increasing sizes.

2. The loading plate structure according to claim 1, wherein said main body includes: a first plate and a second plate disposed corresponding to said first plate; and said at least three recesses comprises two groups of sub-recesses respectively formed on said first plate and said second plate, each of said two groups of sub-recesses comprises three sub-recesses arranged in a stepped manner from bottom to top, wherein sizes and positions of said two groups of sub-recesses are mutually matched, to have the panels be received and supported collectively by said two groups of sub-recesses formed on said first plate and said second plate respectively.

3. The loading plate structure according to claim 2, wherein said taking/disposing location is an interval area between said first plate and said second plate.

4. The loading plate structure according to claim 2, wherein said first plate and said second plate are symmetrical to each other.

5. The loading plate structure according to claim 4, wherein said taking/disposing location is an interval area between the first plate and the second plate.

6. The loading plate structure according to claim 5, wherein a width of said interval area is about 55 mm to 90 mm.

7. The loading plate structure according to claim 1, wherein the size of any side of any of said at least three recesses is larger than the size of the corresponding side of the corresponding panel received therein about 2 mm.

8. A panel carrier comprising: an outer frame loaded thereon with multiple loading plate structures for transporting panels, wherein said multiple loading plate structures have a same specification and are arranged regularly, each said loading plate structure comprising:

a main body;

said main body including at least three recesses respectively for receiving at least three different sizes of panels therein, wherein a size of any side of each of said at least three recesses is larger than a size of a corresponding side of a corresponding one of said at least three different sizes of panels received therein; and a taking/disposing location formed on said main body with an opening for taking or disposing the panels, wherein through said taking/disposing location the panel is disposed in one of said at least three recesses corresponding to a size of the panel, or is taken out from said one of said at least three recesses;

wherein said at least three recesses are formed on the main body from bottom to top in a stepped manner, a smallest size of recess in said at least three recesses is formed on a bottom surface of the main body, and the other recesses in said at least three recesses are disposed one by one from bottom to top with increasing sizes.

9. The panel carrier according to claim 8, wherein said specification of said multiple loading plate structures for transporting the panels loaded on said outer frame are adjustable.

10. The panel carrier according to claim 8, wherein said main body includes: a first plate and a second plate disposed corresponding to said first plate; and said at least three recesses comprises two groups of sub-recesses respectively formed on said first plate and said second plate, each of said two groups of sub-recesses comprises three sub-recesses arranged in stepped manner from bottom to top, wherein sizes and positions of said two groups of sub-recesses are mutually matched, to have the panels be received and supported collectively by said two groups of sub-recesses formed on said first plate and said second plate respectively.

11. The panel carrier according to claim 10, wherein the size of any side of any of said at least three recesses is larger than the size of the corresponding side of the corresponding panel received therein about 2 mm.

12. The panel carrier according to claim 10, wherein said first plate and said second plate are symmetrical to each other.

13. The panel carrier according to claim 12, wherein said taking/disposing location is an interval area between said first plate and said second plate.

14. The panel carrier according to claim 13, wherein a width of said interval area is about 55 mm to 90 mm.

* * * * *